United States Patent
Chen

(10) Patent No.: US 10,420,219 B1
(45) Date of Patent: Sep. 17, 2019

(54) PRINTED CIRCUIT BOARD ADAPTABLE FOR MULTIPLE INTERCONNECTION SLOTS

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventor: Jian-Cai Chen, Wuhan (CN)

(73) Assignees: HONGFUJIN PRECISION INDUSTRY (WUHAN) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/117,155

(22) Filed: Aug. 30, 2018

(30) Foreign Application Priority Data

Jul. 19, 2018 (CN) .......................... 2018 1 0798682

(51) Int. Cl.
*H05K 1/18* (2006.01)
*H05K 1/11* (2006.01)
*H01R 12/71* (2011.01)

(52) U.S. Cl.
CPC ........... *H05K 1/181* (2013.01); *H01R 12/712* (2013.01); *H05K 1/111* (2013.01); *H05K 2201/10022* (2013.01); *H05K 2201/10189* (2013.01)

(58) Field of Classification Search
USPC ....................................................... 174/260
See application file for complete search history.

(56) References Cited

U.S. PATENT DOCUMENTS

| | | | | |
|---|---|---|---|---|
| 5,477,082 A | * | 12/1995 | Buckley, III | H01L 23/5384 257/679 |
| 5,729,894 A | * | 3/1998 | Rostoker | G03F 7/70433 257/693 |
| 5,852,725 A | * | 12/1998 | Yen | G06F 13/409 710/301 |
| 5,926,378 A | * | 7/1999 | DeWitt | G06F 13/409 361/788 |
| 6,129,976 A | * | 10/2000 | Mizushima | F42B 3/121 102/202.14 |
| 6,141,212 A | * | 10/2000 | Fletcher | G06F 13/409 361/679.45 |
| 6,155,842 A | * | 12/2000 | Baitz | G06F 1/184 439/61 |
| 6,162,997 A | * | 12/2000 | Memis | H01L 23/5384 174/260 |
| 6,438,637 B1 | * | 8/2002 | Chen | B23K 3/0638 710/301 |
| 6,632,705 B1 | * | 10/2003 | Kang | G11C 5/025 257/723 |

(Continued)

Primary Examiner — Dimary S Lopez Cruz
Assistant Examiner — Muhammed Azam
(74) Attorney, Agent, or Firm — ScienBiziP, P.C.

(57) ABSTRACT

A printed circuit board (PCB) able to accommodate different types of interconnection slots without an increase in size includes a mounting area which accommodates some individual conductive pads and some conductive sharing pads. When a first type connector is mounted on the PCB, the data pins of the first type connector correspond to the sharing pads and when a second type connector is mounted on the PCB, the data pins of the second type connector correspond to the individual pads and the sharing pads.

15 Claims, 3 Drawing Sheets

(56) References Cited

U.S. PATENT DOCUMENTS

| | | | | |
|---|---|---|---|---|
| 6,717,825 B2* | 4/2004 | Volstorf | H05K 1/114 | 174/262 |
| 6,747,362 B2* | 6/2004 | Barrow | H01L 23/3128 | 174/260 |
| 6,789,148 B1* | 9/2004 | Hinds | H05K 1/142 | 361/679.32 |
| 7,075,797 B1* | 7/2006 | Leonard | G06F 1/184 | 361/785 |
| 7,160,114 B2* | 1/2007 | Chen | H01R 29/00 | 439/55 |
| 7,255,570 B1* | 8/2007 | Feldman | G06F 13/409 | 439/377 |
| 8,162,691 B2* | 4/2012 | Chang | H01R 13/514 | 439/541.5 |
| 8,238,115 B2* | 8/2012 | Chen | G06F 1/185 | 174/250 |
| 8,804,364 B2* | 8/2014 | Li | H05K 1/113 | 174/260 |
| 2002/0016089 A1* | 2/2002 | Dai | H05K 1/116 | 439/55 |
| 2002/0131243 A1* | 9/2002 | Harrison | H05K 1/117 | 361/728 |
| 2005/0032419 A1* | 2/2005 | Kedem | H01R 12/712 | 439/541.5 |
| 2005/0252311 A1* | 11/2005 | Ong | G01L 5/0047 | 73/862.637 |
| 2006/0105597 A1* | 5/2006 | Purwin | G06F 3/0626 | 439/79 |
| 2006/0109636 A1* | 5/2006 | Hood, III | G06F 1/184 | 361/792 |
| 2006/0161717 A1* | 7/2006 | Purwin | H05K 1/117 | 710/315 |
| 2006/0231833 A1* | 10/2006 | Winings | H05K 1/114 | 257/48 |
| 2006/0232301 A1* | 10/2006 | Morlion | H05K 1/114 | 326/126 |
| 2007/0005843 A1* | 1/2007 | Sim | H05K 1/181 | 710/62 |
| 2007/0076580 A1* | 4/2007 | Hsu | G06F 13/4086 | 370/201 |
| 2007/0079041 A1* | 4/2007 | Yang | G06F 1/185 | 710/301 |
| 2007/0133188 A1* | 6/2007 | Su | G06F 1/185 | 361/803 |
| 2010/0046182 A1* | 2/2010 | Jia | H05K 1/14 | 361/760 |
| 2010/0300738 A1* | 12/2010 | Ito | H01L 23/49827 | 174/260 |
| 2011/0019384 A1* | 1/2011 | Kao | G06F 1/183 | 361/803 |
| 2012/0077384 A1* | 3/2012 | Bar-Niv | H01R 27/00 | 439/625 |
| 2013/0107483 A1* | 5/2013 | Jiang | H05K 1/18 | 361/767 |
| 2013/0219097 A1* | 8/2013 | Wang | G06F 1/185 | 710/301 |
| 2013/0265076 A1* | 10/2013 | Pan | G01R 31/40 | 324/756.07 |
| 2013/0316587 A1* | 11/2013 | Takahashi | H01R 12/722 | 439/630 |
| 2016/0174365 A1* | 6/2016 | Lin | H01L 23/49822 | 174/251 |
| 2017/0172007 A1* | 6/2017 | Itkin | H05K 1/117 | |
| 2018/0007788 A1* | 1/2018 | Phares | H01R 12/7076 | |

* cited by examiner

PRINTED CIRCUIT BOARD ADAPTABLE FOR MULTIPLE INTERCONNECTION SLOTS

FIELD

The subject matter herein generally relates to printed circuit boards.

BACKGROUND

In general, electronic products are trending towards micro size and multiple functions. The area on the printed circuit board (PCB) is limited, and a peripheral component interconnect (PCI) slot and a peripheral component interconnect express (PCIe) slot cannot generally be provided at the same time.

BRIEF DESCRIPTION OF THE DRAWINGS

Implementations of the present disclosure will now be described, by way of example only, with reference to the attached figures.

DETAILED DESCRIPTION

Figure 1:
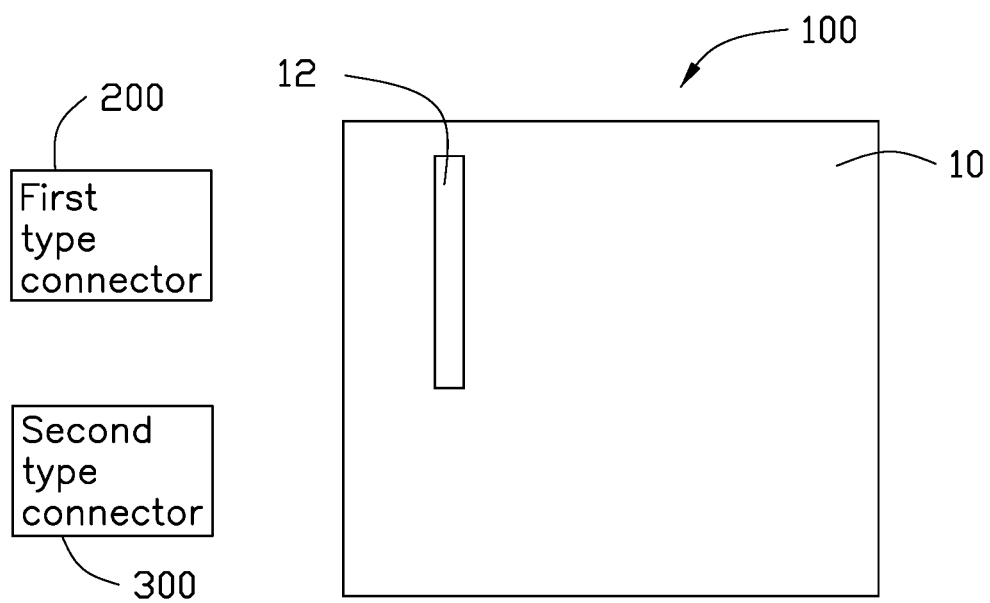
FIG. 1 is a schematic diagram of an exemplary embodiment of a printed circuit board with an interconnection mounting area.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "comprising" means "including, but not necessarily limited to"; it specifically indicates open-ended inclusion or membership in a so-described combination, group, series, and the like.

Figure 2:
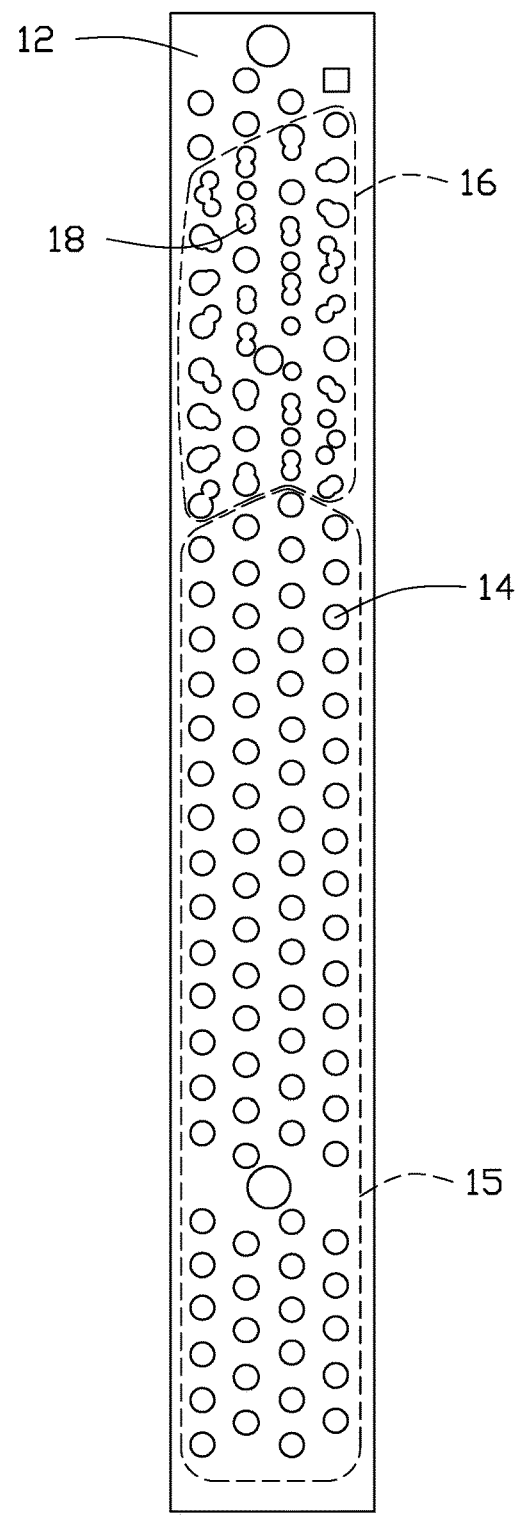
FIG. 2 is a schematic diagram of the mounting area of the system of FIG. 1.

FIG. 1 illustrates a printed circuit board (PCB) 100 in accordance with an exemplary embodiment. FIG. 2 illustrates a mounting area 12 in accordance with an exemplary embodiment. A first type connector 200 or a second type connector 300 can be mounted on the printed circuit board 100.

In this exemplary embodiment, the first type connector 200 can be a peripheral component interconnect express (PCIe) slot, and the second type connector 300 can be a peripheral component interconnect (PCI) slot.

The printed circuit board 100 includes a main body 10. The main body 10 defines the mounting area 12.

The mounting area 12 includes a first pad group 15 and a second pad group 16. The first pad group 15 includes a plurality of individual pads 14, and the second pad group 16 includes a plurality of sharing pads 18. In this exemplary embodiment, both the individual pads 14 and the sharing pads 18 are conductive pads for transmitting electrical signals.

When the printed circuit board 100 mounts the first type connector 200, the data pins (not shown) of the first type connector 200 correspond to each of the sharing pads 18.

When the printed circuit board 100 mounts the second type connector 300, the data pins (not shown) of the second type connector 300 correspond to each of the individual pads 14 and each of the sharing pads 18.

Thus, the printed circuit board 100 can be installed with different types of connectors, to establish communication with different types of expansion cards.

Figure 3:
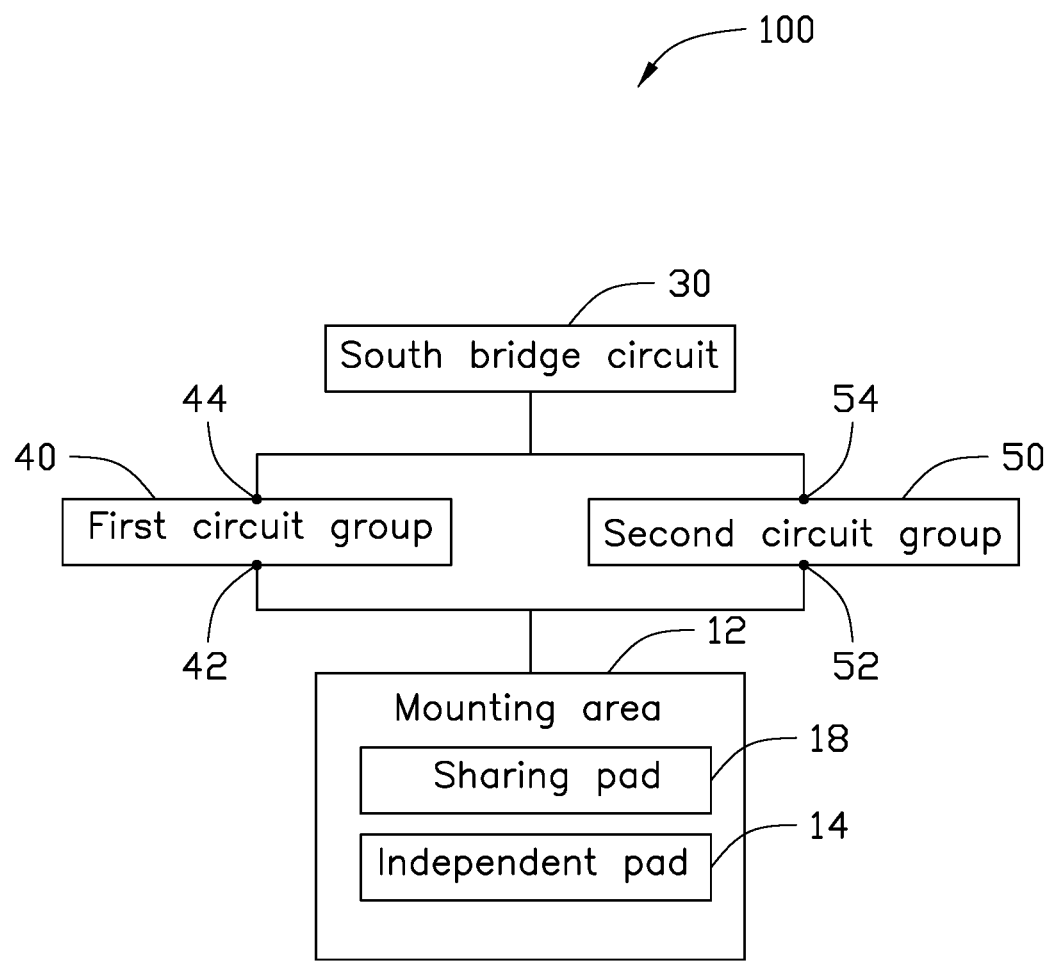
FIG. 3 is a block diagram of an exemplary embodiment of the printed circuit board.

FIG. 3 illustrates that the printed circuit board 100 further includes a south bridge circuit 30, a first circuit group 40, and a second circuit group 50.

The first circuit group 40 corresponds to the mounting area 12, a first end 42 of the first circuit group 40 is electrically coupled to the plurality of sharing pads 18 of the second pad group 16, and a second end 44 of the first circuit group 40 is electrically coupled to the south bridge circuit 30.

The second circuit group 50 corresponds to the mounting area 12, a first end 52 of the second circuit group 50 is electrically coupled to the plurality of sharing pads 18 of the second pad group 16, and a second end 54 of the second circuit group 50 is electrically coupled to the south bridge circuit 30.

The first type connector 200 can establish communication with the south bridge circuit 30 through the first circuit group 40, and the second type connector 300 can establish communication with the south bridge circuit 30 through the second circuit group 50.

In at least one exemplary embodiment, the printed circuit board 100 further includes a plurality of resistors (not shown). The plurality of resistors can be disposed in the first circuit group 40.

When a first type expansion card (not shown) needs to be connected to the printed circuit board 100, the data pins (not shown) of the first type connector 200 correspond to each of the sharing pads 18. The location where the first circuit group 40 is installed on the printed circuit board 100 has to be installed with the plurality of resistors electrically connected between the first end 42 and the second end 44, but another location where the second circuit group 50 is installed on the printed circuit board 100 does not have to be installed with any resistors.

In such a scenario, the first type expansion card inserted into the first type connector 200 can be electrically connected to the south bridge circuit 30 via a data transmission path consisting of the data pins of the first type connector 200, the plurality of sharing pads 18, and the first circuit group 40.

For example, when the first circuit group 40 is installed with the a resistor electrically connected between the first end 42 and the second end 44, one of the sharing pads 18 can be connected to a +5V power supply, and the first type expansion card can communicate with the south bridge circuit 30 through the first type connector 200.

In at least one exemplary embodiment, the plurality of resistors can be disposed in the second circuit group 50.

When a second type expansion card (not shown) needs to be connected to the printed circuit board 100, the data pins (not shown) of the second type connector 300 correspond to each of the individual pads 14 and each of the sharing pads 18. The location where the second circuit group 50 is installed on the printed circuit board 100 has to be installed with the plurality of resistors electrically connected between the first end 52 and the second end 54, but another location where the first circuit group 40 is installed on the printed circuit board 100 does not have to be installed with any resistors.

In such a scenario, the second type expansion card inserted into the second type connector 300 can be electrically connected to the south bridge circuit 30 via a data transmission path consisting of the data pins of the second type connector 300, the plurality of sharing pads 18, the plurality of individual pads 14, and the second circuit group 50.

For example, when the first circuit group 40 is installed with the another resistor electrically connected between the first end 52 and the second end 54, one of the sharing pads 18 can be connected to a +3.3V power supply, and the second type expansion card can communicate with the south bridge circuit 30 through the second type connector 300.

In at least one exemplary embodiment, both the first circuit group 40 and the second circuit group 50 are printed tracks or lines.

The first type connector 200 is not limited to being PCIe-X1, it may also be applicable to PCIe-X4, PCIe-X8, and PCIe-X16.

Therefore, without increasing the PCB size, standard PCIe (such as X1, X4, X8, X16) card and PCI card function can be freely switched to meet different market needs.

The exemplary embodiments shown and described above are only examples. Many details are often found in the art such as the other features of printed circuit board. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A printed circuit board (PCB) on which is mounted a first type connector or a second type connector, the PCB comprising:
   a mounting area comprising a plurality of individual pads and a plurality of sharing pads; and
   a main body defining the mounting area; and
   wherein the plurality of individual pads and the plurality of sharing pads transmit electrical signals;
   wherein when the first type connector is mounted on the PCB, data pins of the first type connector correspond to the plurality of sharing pads; and
   wherein when the second type connector is mounted on the PCB, the data pins of the second type connector correspond to the plurality of individual pads and the plurality of sharing pads.

2. The PCB of claim 1, wherein the PCB comprises a first circuit group, the first circuit group corresponds to the mounting area, and a first end of the first circuit group is electrically coupled to the plurality of sharing pads.

3. The PCB of claim 2, wherein the PCB further comprises a south bridge circuit, and the south bridge circuit is electrically coupled to a second end of the first circuit group.

4. The PCB of claim 3, wherein the PCB further comprises a second circuit group, the second circuit group corresponds to the mounting area, and a first end of the second circuit group is electrically coupled to the plurality of sharing pads.

5. The PCB of claim 4, wherein the south bridge circuit is electrically coupled to a second end of the second circuit group.

6. The PCB of claim 5, wherein the PCB further comprises a plurality of resistors, and the plurality of resistors is disposed in the first circuit group.

7. The PCB of claim 5, wherein the PCB further comprises a plurality of resistors, and the plurality of resistors is disposed in the second circuit group.

8. The PCB of claim 5, wherein both the first circuit group and the second circuit group include printed lines.

9. A printed circuit board (PCB) on which is mounted a first type connector or a second type connector, the PCB comprising:
   a first circuit group;
   a mounting area comprising a plurality of individual pads and a plurality of sharing pads; and
   a main body defining the mounting area;
   wherein the plurality of individual pads and the plurality of sharing pads transmit electrical signals;
   wherein the first circuit group corresponds to the mounting area, and a first end of the first circuit group is electrically coupled to the plurality of sharing pads;
   wherein when the first type connector is mounted on the PCB, data pins of the first type connector correspond to the plurality of sharing pads; and
   wherein when the second type connector is mounted on the PCB, the data pins of the second type connector correspond to the plurality of individual pads and the plurality of sharing pads.

10. The PCB of claim 9, wherein the PCB further comprises a south bridge circuit, and the south bridge circuit is electrically coupled to a second end of the first circuit group.

11. The PCB of claim 10, wherein the PCB further comprises a second circuit group, the second circuit group corresponds to the mounting area, and a first end of the second circuit group is electrically coupled to the plurality of sharing pads.

12. The PCB of claim 11, wherein the south bridge circuit is electrically coupled to a second end of the second circuit group.

13. The PCB of claim 12, wherein the PCB further comprises a plurality of resistors, and the plurality of resistors is disposed in the first circuit group.

14. The PCB of claim 12, wherein the PCB further comprises a plurality of resistors, and the plurality of resistors is disposed in the second circuit group.

15. The PCB of claim 12, wherein both the first circuit group and the second circuit group include printed lines.

\* \* \* \* \*